United States Patent [19]
Armstrong

[11] 3,942,044
[45] Mar. 2, 1976

[54] INTERFACE RECEIVER
[75] Inventor: Desmond Ross Armstrong, Mitcham, England
[73] Assignee: U.S. Philips Corporation, New York, N.Y.
[22] Filed: Mar. 8, 1974
[21] Appl. No.: 449,355

[52] U.S. Cl.......... 307/290; 307/235 T; 307/235 K; 307/DIG. 1
[51] Int. Cl.$^2$..................... H03K 3/286; H03K 5/20
[58] Field of Search........ 307/235 R, 290, 260, 261, 307/DIG. 1, 254; 328/135, 115

[56] References Cited
UNITED STATES PATENTS
3,735,151  5/1973  Frederiksen et al. ........... 307/235 R
3,743,857  7/1973  Fussell .......................... 307/235 R OTHER PUBLICATIONS
IBM Technical Disclosure Bulletin Vol. 8, No. 5, Oct. 1965 p. 810 "Fast Current Threshold Circuit" by B. R. Sowter.

*Primary Examiner*—John Zazworsky
*Attorney, Agent, or Firm*—Frank R. Trifari; Bernard Franzblau

[57] ABSTRACT

A switching circuit is disclosed that is operative from a single supply voltage and is capable of switching in response to both positive and negative voltage input signals and exhibits hysteresis within defined positive and negative threshold voltage limits with respect to a datum voltage level. The circuit includes an input transistor having an input electrode connected to the signal input terminal and a transistor - diode current mirror connected to said input electrode whereby the current mirror defines one of the threshold voltage limits.

17 Claims, 1 Drawing Figure

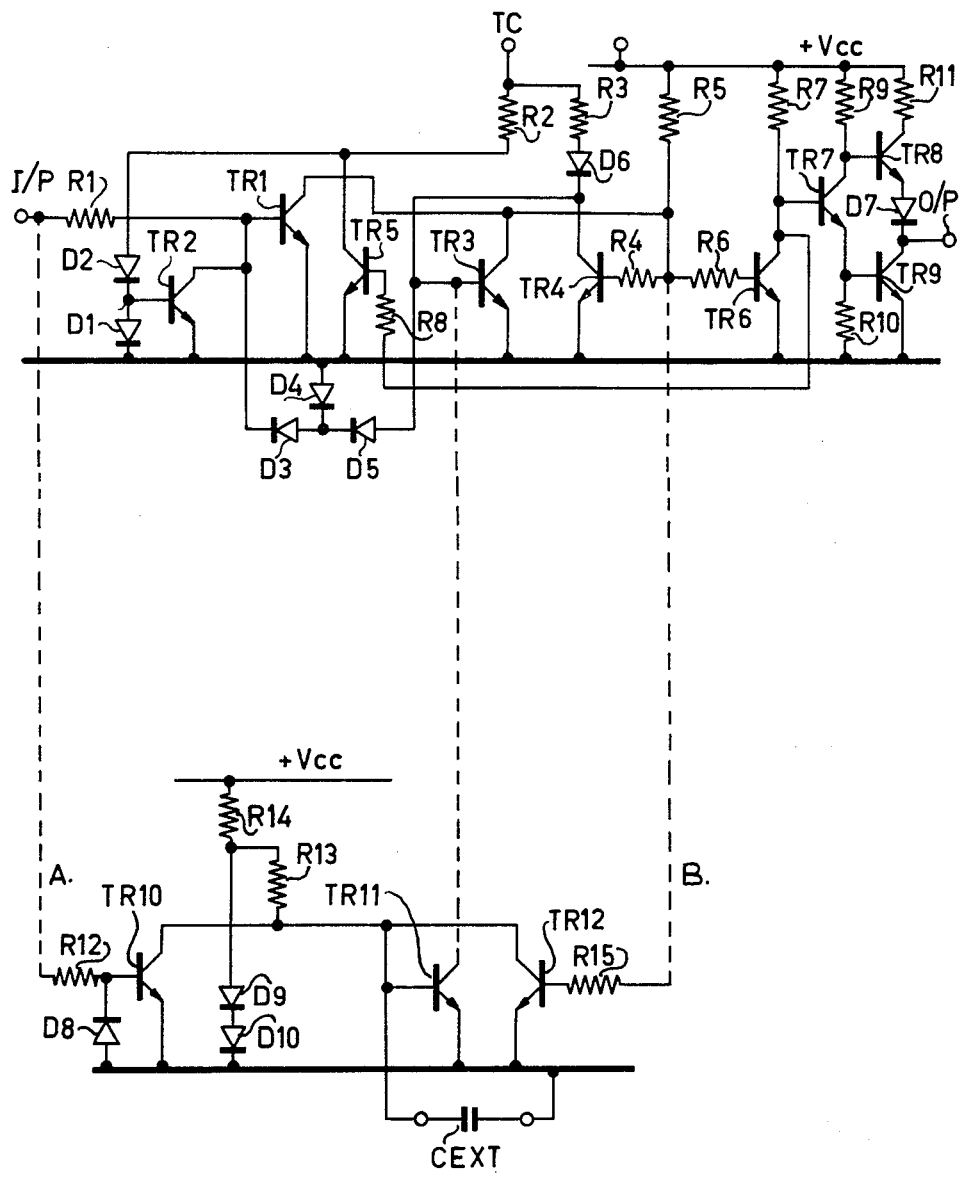

INTERFACE RECEIVER

The present invention relates to a switching circuit capable of switching in reponse to both positive and negative voltage input signals.

Many integrated logic circuits use transistor-transistor logic (TTL) circuits which are typically powered by a single five volt supply applied between a supply voltage rail and a datum voltage rail (e.g. ground) of the circuit. Some signal transmission systems use bipolar signals and it is necessary to convert these to unipolar signals (e.g. +5V and 0V) in a switching circuit before they can be applied to a TTL circuit. Such a switching circuit is required to exhibit hysteresis within defined positive and negative threshold limits with respect to a datum voltage level, that is to say that the circuit switches to a first of its two states when the input signal goes more positive than a positive threshold limit and then stays in that state until the input signal goes more negative than the negative threshold limit, whereupon the circuit switches to its other state. The circuit then remains latched until the input signal again exceeds the positive threshold limit, whereupon it switches to said first state again.

Such circuits are known but require at least two different voltage supply levels. An object of the present invention is to provide a switching circuit which can operate from a single voltage supply level such as is used to supply TTL circuits.

According to the present invention there is provided a switching circuit capable of switching in response to input signals which are both positive and negative with respect to a datum level and which exhibits hysteresis within defined positive and negative threshold voltage limits with respect to the datum voltage level. The circuit is arranged to operate from a single voltage supply applied between a datum voltage rail and a supply voltage rail. The circuit includes an input transistor having an input electrode connected to a signal input terminal of the circuit to which a transistor-diode current mirror is connected, which current mirror defines one of the threshold voltage limits. The collector of the current mirror transistor is connected directly to the input electrode of the input transistor and the emitter of the current mirror transistor is connected directly to the datum voltage level rail.

As is known, a current mirror comprises a transistor having a diode connected directly in parallel with its base-emitter path in the same current-conducting direction. Provided that the base-emitter junction and the diode junction are of identical types and are subject to the same temperature variations, then the emitter current is the same as the diode current, i.e. one is the mirror of the other. If the transistor has a very high gain (in theory, infinite gain) then the base current is negligible and the collector current is always equal to the diode current. Thus the diode current may be controlled to define the maximum collector current of the transistor.

An embodiment of the present invention will now be described, by way of example, with reference to the accompanying drawing which shows a switching circuit in accordance with the present invention.

Referring now to the drawing, input signals are received at an input terminal I/p and are fed through a resistor R1 to the base of a transistor TR1, the emitter of which is connected to the datum rail which for the purposes of the present invention is at ground. The base of TR1 is connected to the collector of a current mirror transistor TR2. The mirror diode D1 is connected to the base electrode of TR2 and, via a diode D2 and a resistor R2 to a threshold control terminal TC. The emitter of TR2 is connected to the ground rail and the collector of TR2 is further connected to a diode D3 the anode of which is connected to the cathodes of diodes D4 and D5. The anode of D4 is connected to the ground (datum) rail and the anode of D5 is connected to the base electrode of a transistor TR3 and to the collector of a transistor TR4. The collector of TR1 is connected both to the collector of TR3 and to the base of TR4 via a resistor R4. The collector of TR4 is connected via a diode D6 and a resistor R3 to the threshold control terminal TC. The transistors TR3 and TR4 form a cross-coupled bistable circuit. The output of the bistable circuit is taken from the collector resistor R5 of TR3 and is fed through a resistor R6 to a transistor TR6, the emitter of which is connected to ground (datum). The collector of TR6 is connected to the base electrode of transistor TR7, to the positive rail +Vcc via a collector resistor R7 and via a feed back path consisting of resistor R8 to a transistor TR5. Transistor TR7, TR8, TR9, resistors R9, R10 and R11, and diode D7 form a normal TTL totem pole type of output stage, the output being taken from the collector of transistor TR9.

A zero detect facility may be connected to the above described circuit for the purpose of detecting when the input voltage remains at or near ground level for a given period of time. This would indicate under normal conditions a fault condition on the input line. The dotted lines are the connections when the fault indication circuit is included within the integrated circuit. The input signal on the input terminal I/p is connected to a resistor R12 and then to a transistor TR10. The reverse $V_{BE}$ of the base of TR10 is protected by a diode D8. The emitter of TR10 is connected to the ground (datum) level and the collector is connected via resistors R13 and R14 to positive supply rail +Vcc, to the base of transistor TR11 and to the collector of transistor TR12. The common point of resistors R13 and R14 is connecting connected via diodes D9 and D10 to the ground (datum) rail. The emitters of transistors TR11, TR12 are connected to the ground (datum) rail and the base of TR11 is connected via an external capacitor to the ground (datum) rail. The collector of TR11 is connected to the base of transistor TR3 and the base of transistor TR12 is connected via a resistor R15 to the base resistor R4 of transistor TR4.

In order to understand the operation of the circuit the steady state condition with a positive input voltage at terminal I/p will now be defined. The diode D3 will be reverse biased and transistor TR1 will be on because the input voltage of +6 volts provides more current through resistor R1 than can be taken by current mirror transistor TR2. The base of TR4 is at a low potential because TR1 is on, therefore TR4 is off and TR3 is on. Since the base of TR4 is at a low potential, so also is the base of TR6 and therefore TR6 is also off. Therefore, via the feedback path, transistor TR5 is on and the collector emitter current of TR5 removes the current available to supply the base of TR2, therefore transistor TR2 is off. In the totem pole output stage transistor TR7 is on and therefore transistor TR9 is on and the output from the collector of TR9 is low (approximately 0 volts). Therefore the receiver overall inverts the input signal.

Let us assume that the input goes negative toward minus 6 volts. The threshold control terminal TC is for the moment assumed to be connected directly to the positive supply rail +Vcc of +5 volts in this particular instance. The ability to vary the threshold of the circuit will be more fully described hereinafter.

As the input goes negative there is no change in the circuit output until the input voltage falls to −2 volts. At an input voltage of −2 volts the voltages at the bases of TR3 and TR4 will exactly balance and the bistable will switch over until TR4 is on and TR3 is off. Transistor TR6 is turned on and transistor TR5 is turned off. Transistor TR7 and TR9 in the totem pole output stage will be off and the output from the collector of TR9 will be positive at approximately +5 volts. Base current for transistor TR2 is now available through diode D2 and this flows through the forward biased base/collector junction of TR2 to the input terminal I/p.

The input threshold voltage at which the circuit changes state is given by the following equation:

$$\frac{Vcc - 2V_{BE}}{R_3} = \frac{(Vin - V_{BE})}{R_1}$$

or $$(Vin - V_{BE}) R_3 - (Vcc - 2V_{BE}) R_1 = 0$$

now if $$R_1 = 5K\ \Omega \text{ and } R_3 = 12.5K\ \Omega$$

we have:

$$12.5\ Vin - 2.5\ V_{BE} - 5\ Vcc = 0.$$

If: $Vcc = 5$ volts,

Therefore $Vin = \frac{25 + 2.5\ V_{BE}}{12.5} = -2$ volts (since $\frac{2.5}{12.5} V_{BE}$ can be neglected and in particular its temperature variation is negligible)

Thus the input voltage threshold is −2 volts since Vin is negative.

Let us now consider the input rising from −6 volts towards +6 volts. There is no change in the output of the circuit until the input voltage rises to a given positive value, e.g. +2 volts. This is because transistor TR2 prevents transistor TR1 from conducting until a defined input current is reached. When the input reaches 0 volts, diode D3 is non-conductive transistors TR2, TR1 and TR5 are off and diode D2 is conducting. When the collector of TR2 rises towards $+V_{BE}$ a mirror current is defined TR2 by means of the normal mirror technique in which a diode D1 is connected across the base-emitter junction of transistor TR2. Transistor TR2 will therefore take all the available input current until its limit, as defined by the mirror current through diode D1 and determined by R2 is reached. This limit is arranged to be at an input voltage of +2 volts by making R2=R3=12.5K $\Omega$, since the above equation applies with R2 substituted for R3. If the input voltage rises above +2 volts there will be a "spare" current available to drive the base of transistor TR1 and, when transistor TR1 begins to conduct, the bistable circuit TR3, TR4 will change state so that TR3 is on and TR4 is off. This will now return us to the original state of the circuit when the input stood at +6 volts.

Therefore both a positive and negative threshold are defined using only one positive supply rail. It is to be understood that a complementary circuit could be constructed using a negative supply rail voltage.

The positive and negative threshold voltages may be decreased by interposing a resistor between the threshold control terminal TC and the positive supply rail +Vcc or increased by connecting the threshold control terminal TC to a higher voltage than Vcc. Since the positive and negative threshold voltages are proportional to R1/R2 and R1/R3 respectively, these voltages may be changed by varying the resistance ratios accordingly.

The zero detect facility has two inputs A and B respectively to the bases of transistors TR10 and TR12 from the input terminal I/p and from the base resistor R4 of TR4. When the input signal at the input terminal is positive TR10 conducts and TR12 is off. The collector voltage of TR10 is therefore low and the base of TR11 is low keeping TR11 off. When the input signal is at −6 volts transistor TR10 is off but transistor TR12 is conducting since TR3 is off and the base of TR4 is at a positive potential. Therefore, once again transistor TR11 is held off. In the absence of a positive input on terminal A or B neither transistor TR10 nor transistor TR12 will conduct and therefore the base of TR11 will become positive and TR11 will be turned on when its base potential has risen to $+V_{BE}$ above the ground (datum) level. The time taken for the base potential of TR11 to rise to $+V_{BE}$ is determined by the external capacitor Cext. and by resistors R13 and R14. When TR11 turns on the base of TR3 is pulled down so that TR3 is turned off, as in the case of a negative input signal, the output of the switching circuit being defined to be the state in which a negative input signal is received. An input at B is therefore established to the zero detect circuit which turns transistor TR12 on. Transistor TR12 turns TR11 off and discharges the capacitor Cext. The diodes D9 and D10 are included so that a low positive voltage is established at the common point of resistors R13 and R14, so that a comparatively low value of resistance can be used to provide a suitable delay.

This zero detect facility circuit will normally be incorporated on the same integrated circuit chip as the switching circuit and therefore in some applications in which it is not required it may be rendered inoperative by shorting together the external capacitor terminals.

What is claimed is:

1. A switching circuit adapted to switch states in response to both positive and negative voltage input signals and which exhibits a hysteresis characteristic within defined positive and negative threshold voltage limits with respect to ground voltage comprising, means for energizing said switching circuit from a single voltage supply applied between a ground voltage rail and a supply voltage rail, a signal input terminal for applying said positive and negative voltage input signals to the circuit, an input transistor having an input electrode connected to said signal input terminal, a transistor-diode current mirror having the collector of the current mirror transistor connected directly to the input electrode of the input transistor and the emitter of the current mirror transistor connected directly to the ground voltage rail, and means including said current mirror for defining one of the threshold voltage limits.

2. A switching circuit according to claim 1 further comprising first and second resistances, means connecting the input electrode of the input transistor to the input terminal via said first resistance, and means for feeding a current to the current mirror diode via said second resistance so that one of the two voltage thresholds is proportional to the ratio of the first and second resistances.

3. A switching circuit according to claim 2 further comprising a second transistor connected in the circuit so that an input signal more positive than the positive threshold voltage causes conduction in the input transistor and the second transistor and an input signal more negative than the negative threshold value causes the second transistor to be non-conducting.

4. A switching circuit according to claim 3 including a third transistor cross-coupled with the second transistor to form a bistable circuit so that rapid switching between states is obtained irrespective of the rate of change of the input signal voltage.

5. A switching circuit according to claim 3 further comprising a series chain including a third resistance and at least one further diode connected in that order from a threshold voltage control terminal to the input electrode of the input transistor, and means connecting the input electrode of the second transistor to a point on the chain intermediate the third resistance and the further diode, whereby the other of the two voltage thresholds is proportional to the ratio of the first and third resistances.

6. A switching circuit as claimed in claim 5 wherein the current feeding means includes means connecting the end of the second resistance remote from the current mirror diode to said threshold voltage control terminal.

7. A switching circuit according to claim 5 wherein the threshold voltage control terminal is connected to the supply voltage rail.

8. A switching circuit according to claim 1 further comprising an auxiliary circuit coupled to the signal input terminal and which determines the state of the switching circuit if the input signal voltage remains near to the datum voltage level for a given time period.

9. A switching circuit according to claim further comprising an auxiliary circuit coupled to the signal input terminal and the bistable circuit and including means for controlling the state of the bistable element if the input signal voltage remains near to the datum voltage level for a given time period.

10. A switching circuit that exhibits a hysteresis characteristic within defined positive and negative voltage threshold switching levels with respect to a reference voltage and adapted to switch states in response to positive and negative voltage input signals comprising, a source of supply voltage connected between a reference voltage terminal and supply voltage terminal, means coupling the switching circuit to said reference and supply voltage terminals, a signal input terminal, an input transistor having an input electrode connected to said signal input terminal and first and second electrodes coupled to the reference and supply voltage terminals, respectively, a current mirror device having first, second and third terminals, means connecting said first, second and third current mirror terminals to the input electrode of the input transistor, the reference voltage terminal and to a voltage control terminal which supplies a voltage that is independent of the voltage at said signal input terminal, respectively, so that the current mirror device defines one of said voltage threshold levels.

11. A switching circuit as claimed in claim 10 wherein the input and first electrodes of the input transistor comprise its base and emitter electrodes, respectively, and the terminals of said current mirror device are connected so that the current mirror will shunt the base current of the input transistor.

12. A switching circuit as claimed in claim 10 wherein the input and first electrodes of the input transistor comprise its base and emitter electrodes, respectively, and said current mirror device comprises, a transistor with its collector connected to said first terminal, its emitter connected to said second terminal and its base connected to said third terminal, and a diode connected between said second and third terminals.

13. A switching circuit as claimed in claim 10 further comprising a second transistor controlled in part by the voltage at the second electrode of the input transistor so that an input signal more positive than the positive threshold voltage causes the input transistor and the second transistor to conduct and an input signal more negative than the negative threshold voltage causes the second transistor to cut-off conduction.

14. A switching circuit as claimed in claim 10 further comprising a switching transistor connected between the second and third terminals of the current mirror device and having a control electrode controlled at least in part by the voltage at the second electrode of the input transistor.

15. A switching circuit as claimed in claim 10 further comprising first and second impedance elements, the first impedance element being connected between the signal input terminal and the input electrode of the input transistor and the second impedance element being connected between the voltage control terminal and the third terminal of the current mirror device whereby one of the voltage threshold levels is determined by the values of said first and second impedance elements.

16. A switching circuit as claimed in claim 15 further comprising a second transistor controlled in part by the voltage at the second electrode of the input transistor and a third impedance element and a diode connected in series between the voltage control terminal and the input electrode of the input transistor, and means connecting a control electrode of the second transistor to a junction point between the third impedance element and the diode whereby the other one of the voltage threshold levels is determined by the values of said first and third impedance elements.

17. A switching circuit as claimed in claim 10 further comprising, second and third transistors cross-coupled to form a bistable circuit having an input terminal coupled to the second electrode of the input transistor, and an auxiliary circuit including a switching transistor having an output electrode coupled to an input terminal of the bistable circuit and an input electrode, said auxiliary circuit further comprising first and second input terminals coupled to the signal input terminal and the second electrode of the input transistor, respectively, and means coupled to the switching transistor input electrode and responsive to the signal voltages at said auxiliary circuit first and second input terminals for controlling the state of said switching transistor whenever the input signal voltage remains at a level approximating the reference voltage level for a given period of time.

* * * * *